(12) United States Patent
Hashimoto

(10) Patent No.: US 6,215,210 B1
(45) Date of Patent: Apr. 10, 2001

(54) MOTOR, STRUCTURE OF STATOR OF THE MOTOR AND ASSEMBLY METHOD OF THE STATOR

(75) Inventor: Isamu Hashimoto, Fujieda (JP)

(73) Assignee: Victor Company of Japan, Ltd., Yokohama (JP)

( * ) Notice: Subject to any disclaimer, the term of this patent is extended or adjusted under 35 U.S.C. 154(b) by 0 days.

(21) Appl. No.: 09/495,430

(22) Filed: Jan. 31, 2000

Related U.S. Application Data

(62) Division of application No. 09/156,168, filed on Sep. 17, 1998, now Pat. No. 6,049,147.

(30) Foreign Application Priority Data

Sep. 19, 1997 (JP) .................................................. 9-273502
Jan. 29, 1998 (JP) ................................................. 10-017316

(51) Int. Cl.⁷ .................................................. H02K 15/00
(52) U.S. Cl. ........................... 310/42; 310/67 R; 310/90; 310/254; 310/DIG. 6; 29/596
(58) Field of Search ............................. 310/254, 42, 156, 310/67 R, DIG. 6, 90, 71; 29/596

(56) References Cited

U.S. PATENT DOCUMENTS 5,173,628 * 12/1992 Yoshida et al. ..................... 310/71
5,461,271 * 10/1995 Asama et al. ....................... 310/91

* cited by examiner

Primary Examiner—Burton Mullins
(74) Attorney, Agent, or Firm—Anderson, Kill & Olick P.C.

(57) ABSTRACT

The present invention provides a motor and a stator structure of the motor and an assembly method of the stator structure and a method of installing the motor. The stator structure of the motor contains a stator substrate having a double-layer structure of a printed circuit board and a magnetic plate jointed together at a plurality of calking sections, wherein a centroid is determined with respect to the plurality of calking sections on the printed circuit board, and a vacant area having no electric parts provided is determined nearby the centroid on the printed circuit board to allow the vacant area to be supported by a retainer of a calking jig.

3 Claims, 9 Drawing Sheets

MOTOR, STRUCTURE OF STATOR OF THE MOTOR AND ASSEMBLY METHOD OF THE STATOR

This application is a divisional application of application No. 09/156,168 filed Sep. 17, 1998, now U.S. Pat. No. 6,049,147.

BACKGROUND OF THE INVENTION

1. Field of the Invention

The present invention relates to a motor, and in particular, relates to a structure of a stator thereof comprising a magnetic plate and a printed circuit board stacked together by calking and an assembly method of the stator.

2. Description of the Related Art

Presently, in a tape recorder and a video tape recorder, a capstan shaft is used in a combination of a pinch roller to transport a magnetic tape at a constant speed. The capstan shaft is driven at a constant speed by a motor. Recently, a direct drive method is employed, wherein the capstan shaft is directly connected to a rotor of a capstan motor.

In such a capstan motor as employing the direct drive method, the capstan motor generally comprises a rotor and a stator. The stator comprises a stator substrate having a magnetic plate made of a zinc steel sheet and a printed circuit board stacked together by calking, a bearing holder for rotatably supporting the capstan shaft through bearings and a stator core having windings and forming magnetic circuits, wherein the the stator core and the bearing holder are fixed to the stator substrate. The capstan shaft is integrally fixed to the rotor thereof.

SUMMARY OF THE INVENTION

Accordingly, a general object of the present invention is to provide a motor, a method of installing the motor, a structure of a stator of the motor and an assembly method of the stator.

A specific object of the present invention is to provide a stator structure of a motor, the stator structure comprising a stator substrate having a double-layer structure of a printed circuit board and a magnetic plate jointed together at a plurality of calking sections, wherein a centroid is determined with respect to the plurality of calking sections on the stator substrate, and defining a vacant area having no electric parts disposed nearby the centroid on the printed circuit board to allow the vacant area to be supported by a supporter of a calking jig.

Another and more specific object of the present invention is to provide an assembly method of a stator structure of a motor, the stator structure including a stator substrate having a double-layer structure of a printed circuit board and a magnetic plate jointed together at a plurality of calking sections, the method comprising steps of: determining a centroid with respect to the plurality of calking sections on the stator substrate; defining a vacant area without electric parts mounted nearby the centroid on the printed circuit board; calking the plurality of calking sections by using a calking jig having a plurality of calking pins for pressing the plurality of calking sections and having a retainer section for supporting the stator substrate, wherein the plurality of calking pins are disposed at positions agreeing to the plurality of calking sections provided on the printed circuit board and the retainer section is disposed facing a vicinity of the centroid so as to allow the retainer section to support the vacant area when the plurality of calking sections are calked by the plurality of the calking pins of the calking jig.

Other specific object of the present invention is to provide a motor composed of a rotor and a stator, the stator including a motor base, a printed circuit board stacked on a bottom of the motor base and a bearing holder mounted on the motor base and a magnetic core section having a plurality of stator coils, the rotor including a capstan shaft rotatably supported by the bearing holder through bearing means, a rotor yoke provided at an end of the capstan shaft, wherein the rotor is rotated by a mutual magnetic action between magnets provided on the rotor yoke and the plurality of the stator coils of the stator, wherein the bearing holder is provided with a flange protruding therefrom, the flange having motor base installation sections and core installation sections, and wherein the magnetic core section has a ring section provided with plural magnetic cores around an outer circumference thereof and has plural installation branches protruding radially toward a center of the ring section and respectively having installation portions connected respectively to the core installation sections of the flange, the plural installation branches defining cutout portions therebetween, and wherein the motor is assembled by causing the flange of the bearing holder to be interposed between the motor base and the plural installation branches together with the printed circuit board underneath, and ends of the stator coils are connected to respective terminal sections provided on the printed circuit board being partially exposed through the cutout portions defined between the plural installation branches of the ring section.

Other specific object of the present invention is to provide a method of installing a motor composed of a stator and a rotor, the stator including a motor base, a bearing holder mounted on the motor base and a magnetic core section having a plurality of stator coils, the rotor including a capstan shaft rotatably supported by the bearing holder through bearing means, a rotor yoke provided at an end of the capstan shaft, wherein the rotor is rotated by a mutual magnetic action between magnets provided on the rotor yoke and the plurality of the stator coils of the stator, wherein the bearing holder is provided with a flange protruding therefrom; the flange having motor base installation sections and core installation sections; and wherein the core section has a ring section provided with plural magnetic cores around an outer circumference thereof and plural installation branches protruding toward a center of the ring section and having respective installation portions connected respectively to the core installation sections of the flange, and wherein the motor is assembled by causing the flange of the bearing holder to be interposed between the motor base and the plural installation branches in such a manner that the motor base installation sections of the flange are exposed between the plural installation branches, and wherein a pinch roller of an apparatus is disposed on and pushed along a line toward the capstan shaft of the motor, wherein the line extends from one of the motor base installation sections to one of the plural installation branches.

Other objects and further features of the present invention will be apparent from the following detailed description.

BRIEF DESCRIPTION OF THE DRAWINGS

FIG. 2 (*b*) is a side view showing the structure of the stator shown in FIG. 2 (*a*);

DETAILED DESCRIPTION OF THE PREFERRED EMBODIMENT

Figure 1:
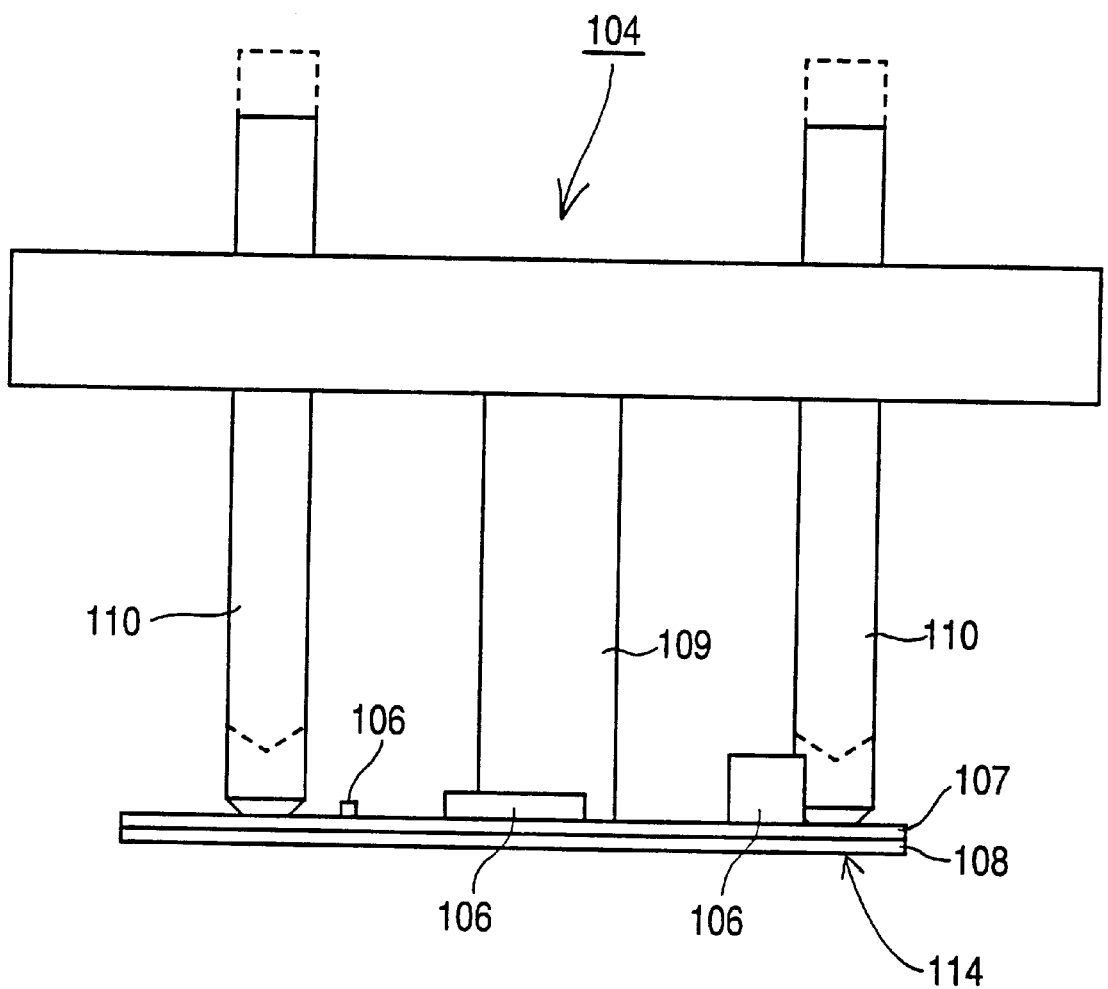
FIG. 1 is a side view showing a calking jig.
Figure 2A:
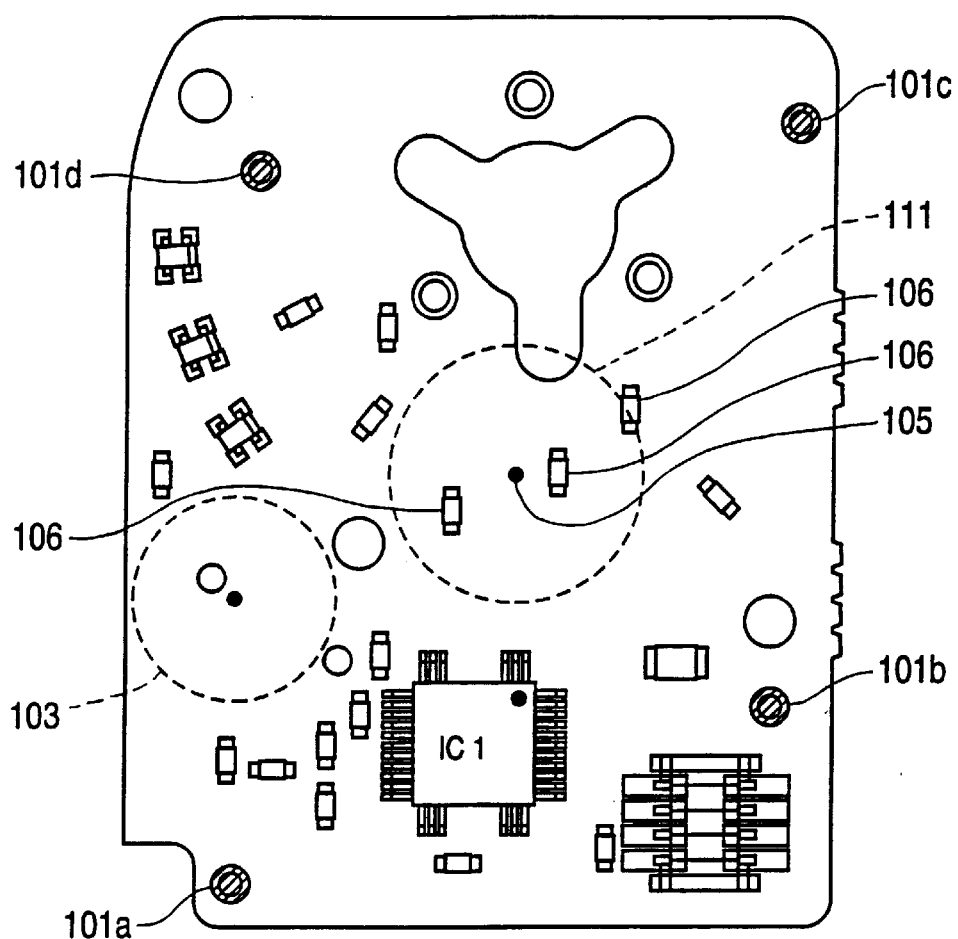
FIG. 2 (*a*) is a plan view showing a structure of a stator in the related art.
Figure 2B:
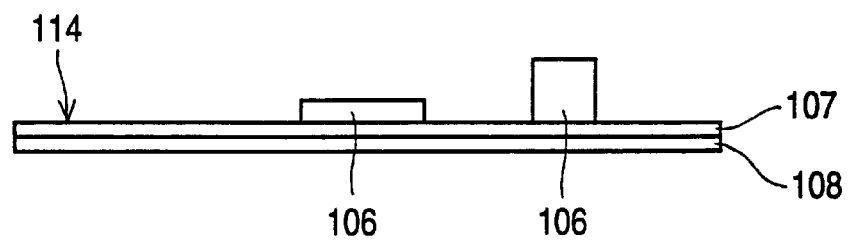
Figure 3A:
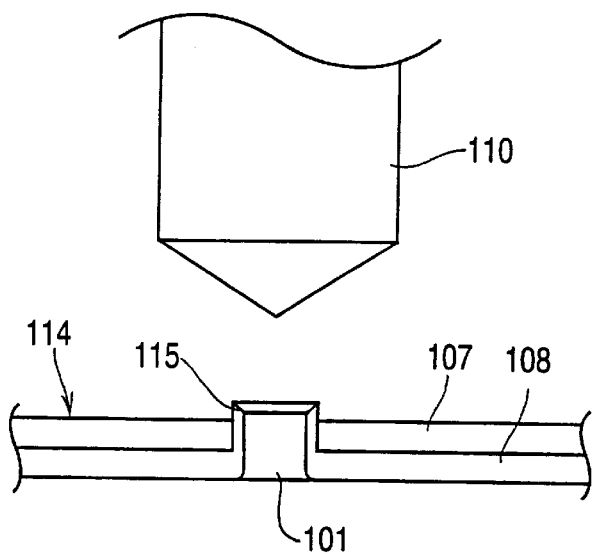
FIGS. 3 (*a*) to 3 (*c*) are schematic views for explaining a calking process.
Figure 3B:
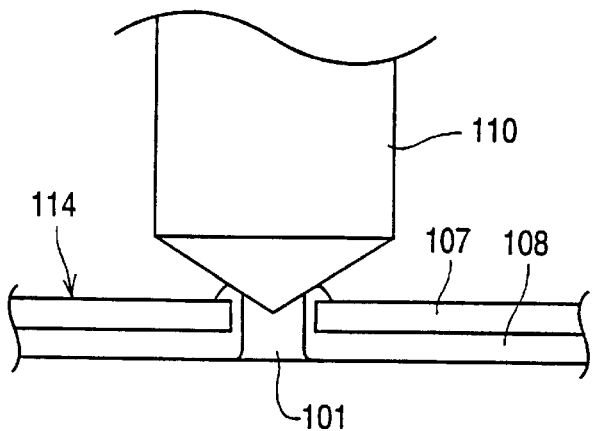
Figure 3C:
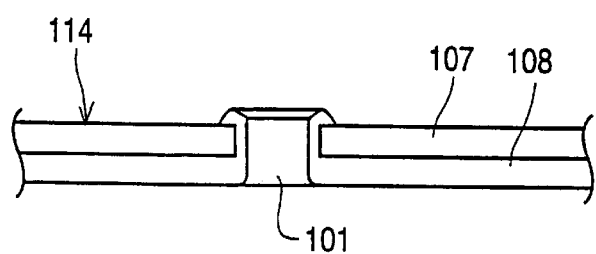

FIG. 1 is a side view showing a calking jig;

FIG. 2 (a) is a plan view showing a structure of a stator in the related art;

FIG. 2 (b) is a side view showing the structure of the stator shown in FIG. 2 (a); and FIGS. 3 (a) to 3 (c) are schematic views for explaining a calking process.

Referring to FIGS. 2 (a) and 2(b), a stator substrate 114 is formed by stacking a magnetic plate 108 made of a zinc steel sheet and a printed circuit board 107 on which a plurality of electric parts 106 are mounted. In the printed circuit board 107, there are provided plural calking sections 101a, 101b, 101c and 101d.

Upon calking a burring portion 115 of the calking sections 101a, 101b, 101c and 101d, a calking jig 104 is used as shown FIG. 1, wherein a reference character 110 designates a calking pin and 109 a calking retainer for preventing the stator substrate 114 from being displaced when calked.

Referring to FIGS. 3 (a) to 3 (c) wherein an exemplary calking pin 110 and a burring portion 115 are depicted, the plural burring portions 115 of the calking sections 101a, 101b, 101c, 101d are calked by being pressed by the calking pins 110, each provided in the calking jig 104 at a position corresponding to each of the positions of the burring portions 115 provided in the stator substrate 114, while a vacant area 103 on the printed circuit board 107 where the electric parts 106 are not provided, is supported by being pressed by the retainer 109.

Referring to FIGS. 2(a) and 2(b), a reference character 111 designates a flat circular area having a diameter of 20 mm of which a center corresponds to a centroid 105 (referred to as calking centroid) with respect to the calking sections 101a, 101b, 101c and 101d. However, the flat circular area 111 is not supported by the calking retainer 109 because the some electric parts 106 are provided in the flat circular area 111, thus, the calking retainer 109 is disposed to the vacant area 103.

Generally, in the stator substrate 114 integrally made of the printed circuit board 107 and the magnetic plate 108 being calked, the degree of dimensional accuracy of the printed circuit board 107 is lower than that of the magnetic plate 108. Thus, the printed circuit board 107 is apt to warp or buckle depending on the way of calking the burring portions 115.

In the related art shown in FIGS. 2(a) and 2(b), the calking sections 101a, 101d could be calked in a high degree of dimensional accuracy, however, the calking sections 101b, 101c could not be done due to warping and buckling of the printed circuit board 107, resulting in a hollow developed between the printed circuit board 107 and the magnetic plate 108. As a result, there were problems of butting of the stator substrate 114 with the rotor 112 of the motor.

Referring to FIGS. 1, 3 (a) to (c) and 4 to 7, the detailed description of the present invention is given of a motor of a first embodiment according to the present invention, wherein like parts are designated with like reference characters in the prior art, and the detailed description is omitted here.

Figure 4:
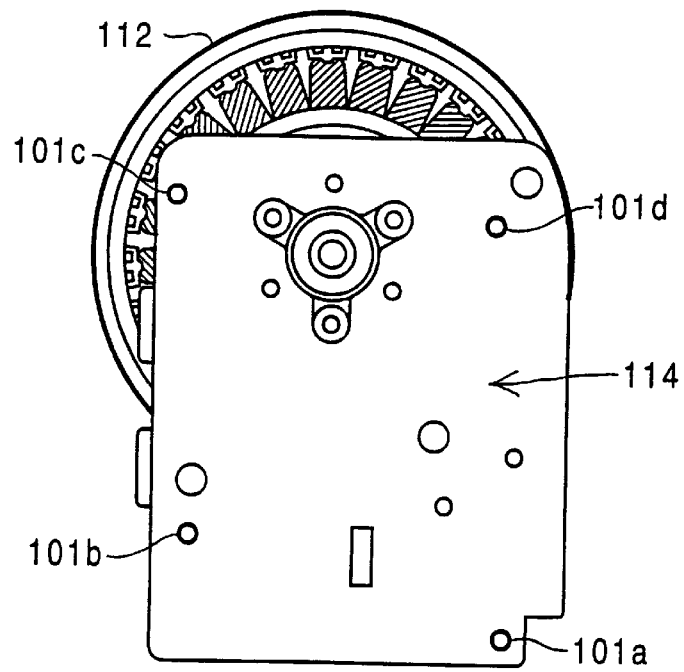
FIG. 4 is a plan view showing a capstan motor for VTR (video tape recorder) employing a stator structure of a first embodiment in the present invention.
Figure 5:
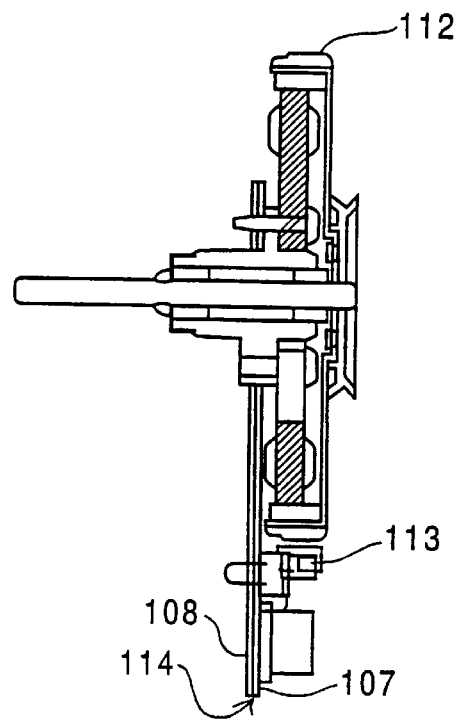
FIG. 5 is a side view showing the capstan motor shown in FIG. 4.
Figure 6:
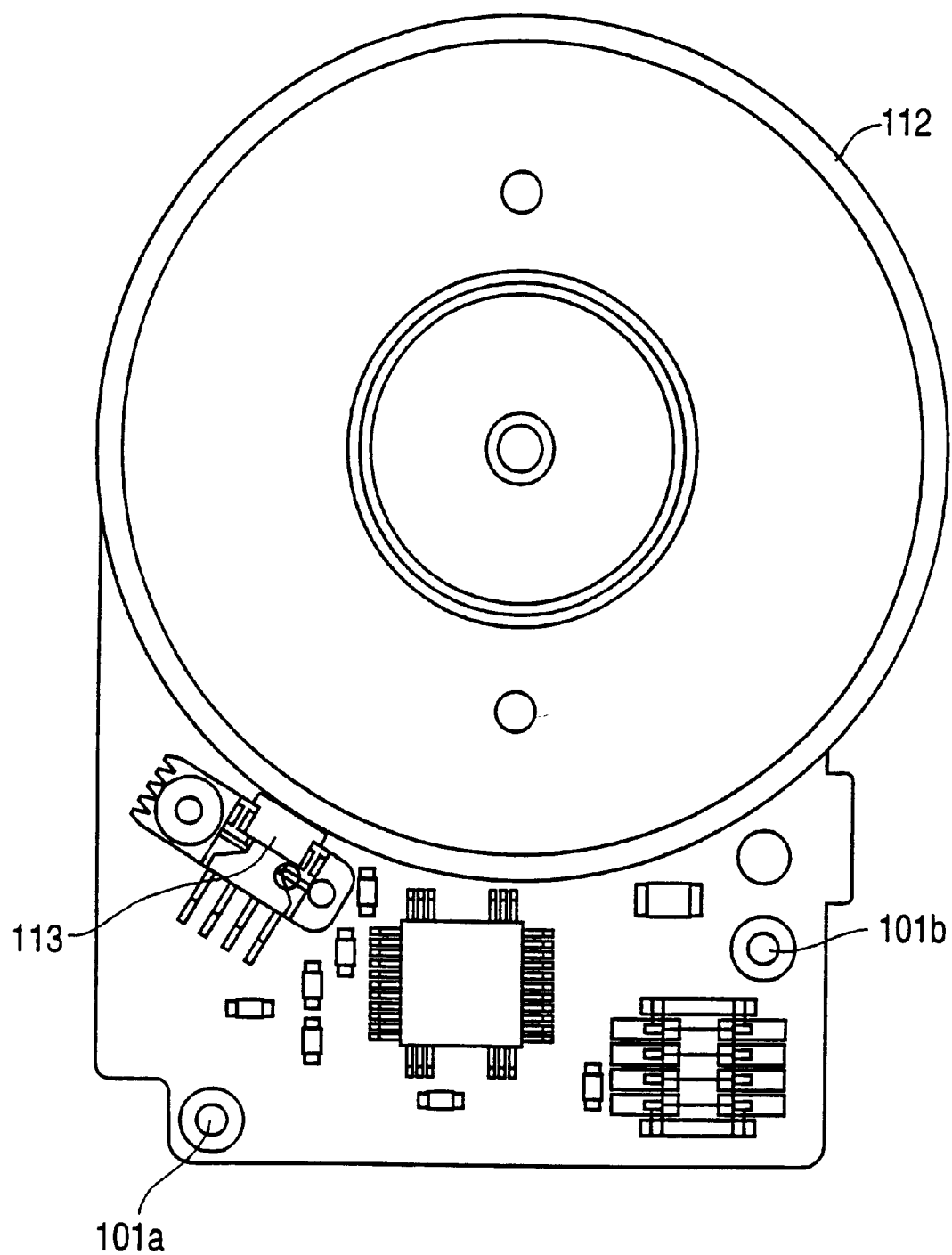
FIG. 6 is a plan view showing a surface for mounting electric parts on the capstan motor.
Figure 7:
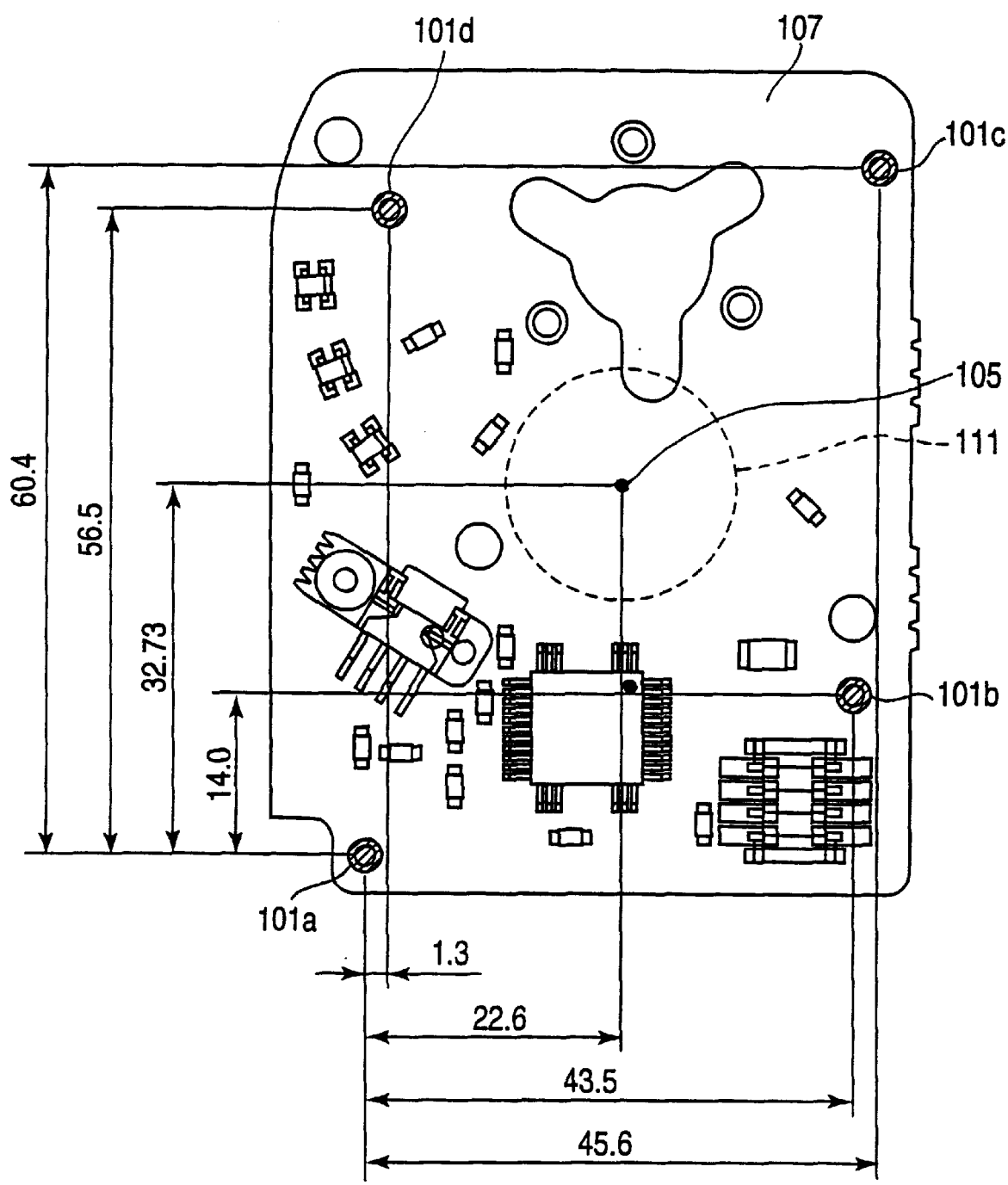
FIG. 7 is a plan view showing a stator structure of the first embodiment of the present invention.

FIG. 4 is a plan view showing a capstan motor for VTR (video tape recorder) employing a stator structure of a first embodiment in the present invention;

FIG. 5 is a side view showing the capstan motor shown in FIG. 4;

FIG. 6 is a plan view showing a surface for mounting electric parts in the capstan motor: and FIG. 7 is a plan view showing a stator structure of the first embodiment in the present invention.

Referring to FIGS. 4 and 5, a capstan motor for a VTR of a first embodiment is composed of 24 slots and 16 magnetic poles. Around an outre circumference of a rotor 112, there are provided magnetic sensors 113 of MR elements. A stator substrate 114 has a double-layer structure of a printed circuit board 107 and a zinc steel sheet (as the magnetic plate) 108, which are integrally jointed at four calking sections 101a, 101b, 101c, 101d.

Upon calking, a calking centroid (center of gravity) 105 with respect to the calking sections 101a, 101b, 101c, 101d is determined on the stator substrate 104 by calculating as mentioned hereinafter referring to FIG. 7.

On the printed circuit board 107, there is defined a flat circular section 111 of a diameter of 5 to 20 mm having a center corresponding to the calking centroid 105 mentioned above, and the electric parts 106 are not provided on the flat circular section 111.

Referring to FIG. 1, the calking pins 110 of the calking jig 104 are disposed to butt the calking sections 101a, 101b, 101c, 101d of the stator substrate 114. The calking retainer 109 of the calking jig 104 has a flat surface at an distal end thereof and is disposed to face the flat circular section 111 having its center corresponding to the calking centroid 105 to allow the printed circuit board 107 to be supported.

As shown in FIG. 3(a), the plural burring portions 115 are formed as parts of the zinc steel sheet 108 so as to slightly protrude from the printed circuit board 107. The calking pins 110 of the calking jig 104 are disposed to face the burring portions 115. As shown in FIG. 3(b), the burring portions 115 are pressed from a printed circuit board side by the calking pins 110, resulting in that the burring portions 115 are calked, as shown in FIG. 3 (c). In this case, calking is made by causing the stator substrate 114 to be supported by the calking retainer 109. Thus, it is possible to integrally joint the printed circuit board 107 and the zinc steel sheet 108 together in a high degree of dimensional accuracy.

As mentioned above, the plural calking sections 101a, 101b, 101c, 101d are simultaneously calked by causing the stator substrate 114 to be supported by the calking retainer 109 at the calking centroid 105 of the calking sections 101a, 101b, 101c, 101d and pressing thereof simultaneously by 4 of the calking pins 110. Thus, it is possible to prevent the warp, buckling and rising of the printed circuit board 107 from developing.

Next, the description is given of how to determine the calking centroid 105.

When a position of the calking section 101a is made to be the origin: (0, 0), a distance (mm) from the origin to each of the calking sections 101b, 101c, 101d is expressed in (x, y) coordinates, for instance, as follows.

the calking section 101b: (43.5, 14.0)
the calking section 101c: (45.6, 60.4)
the calking section 101d: (1.3, 56.5)

Thus, when the calking centroid 105 is represented by coordinates (x,y), the x coordinate and the y coordinate are represented as follows.

$$x = \frac{1}{4}(0+43.5+45.6+1.3) = 22.6, \text{ and}$$

$$y = \frac{1}{4}(0+14.0+60.4+56.5) = 32.73.$$

Accordingly, the position of the calking centroid 105 can be determined as (x,y) =(22.6, 32.6). As mentioned in the foregoing, on the flat circular area 111 having a diameter of 20 mm having the center corresponding to the calking centroid 105, any electric parts 106 are not provided. The diameter of the calking retainer 109 is slightly made smaller than that of the flat circular area 111. Thus, there is no contact of the calking retainer 109 with the electric parts 106, resulting in efficient holding of the printed circuit board 107.

Needless to say, it is possible to optionally determine a size of the flat circular area 111 where the electric parts 106 are not provided, and the size of the diameter of the calking retainer 109 in accordance with the number of the calking sections 101 and the size of the printed circuit board 107.

As mentioned in the foregoing, according to the stator structure of the present invention, the stator substrate has a double-layer structure of the printed circuit board and the zinc steel sheet, and they are calked together at the four calking sections. At that time, the calking centroid is determined from the four calking sections. The electric parts are not provided within the flat circular area having a diameter of 20 mm of which a center corresponds to the calking centroid. Upon calking, the calking sections located around the outer circumference of the flat circular area are calked by causing the flat circular area to be held with the calking retainer. Thus, each of the calking sections in the printed circuit board is equally pressed with the calking pins, resulting in a prevention of the warp and rising of the printed circuit board.

According to the stator structure of the present invention, it is possible to prevent the warp and rising of the printed circuit board. Thereby, the stator substrate is securely made to be a flat plate, resulting in no contact of the stator substrate with the rotor and no vibration in a hollow developed between the printed circuit board and the magnetic plate due to the warp and rising of the printed circuit board.

Further, according to a method of the present invention that the electric parts are not provided on the flat circular area of which center corresponds to the calking centroid, it does not need an additional cost particularly because the printed circuit board can be designed or formed by the ordinary method.

Figure 8:
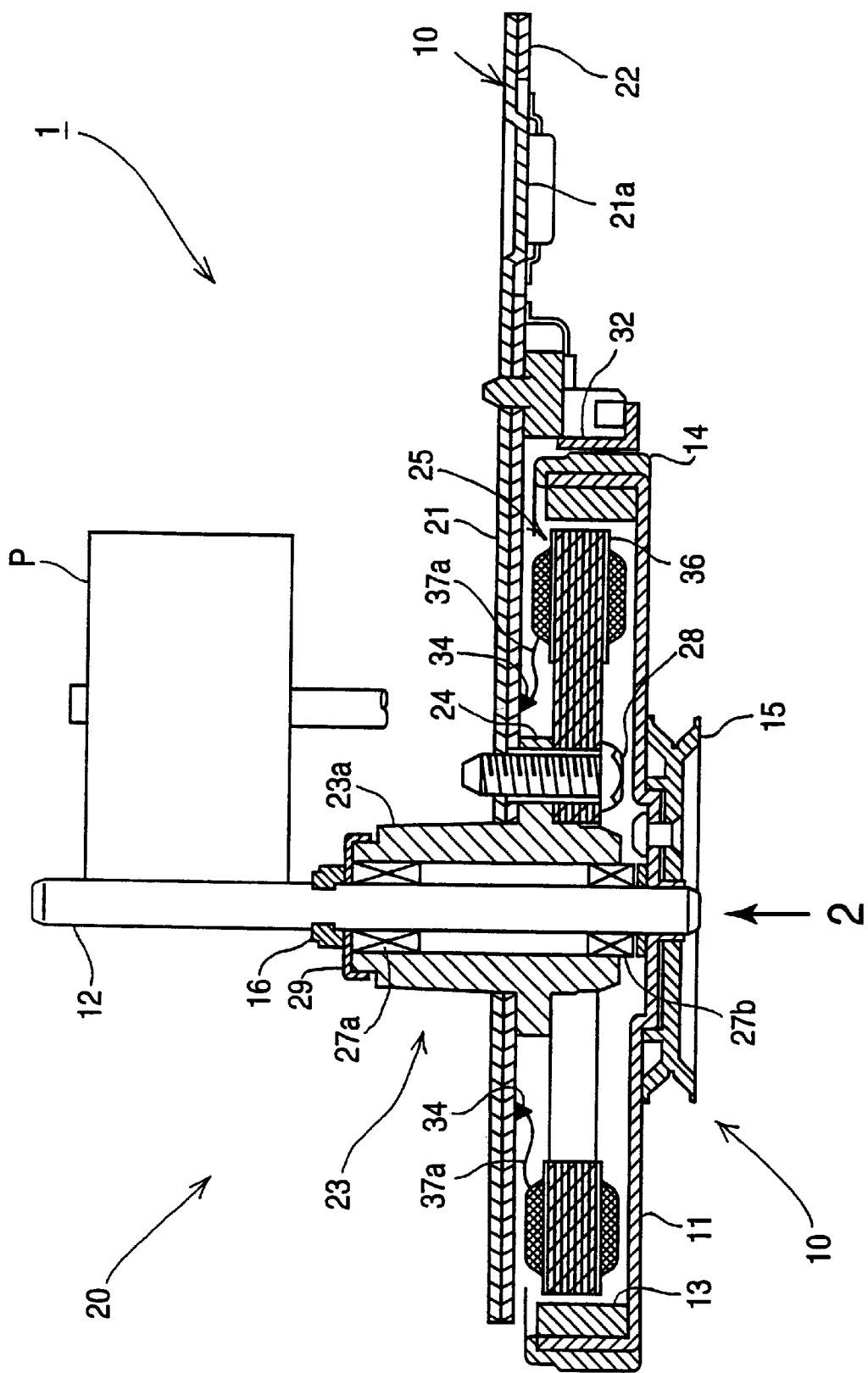
FIG. 8 is a sectional view showing a brushless motor of a second embodiment of the present invention.
Figure 9:
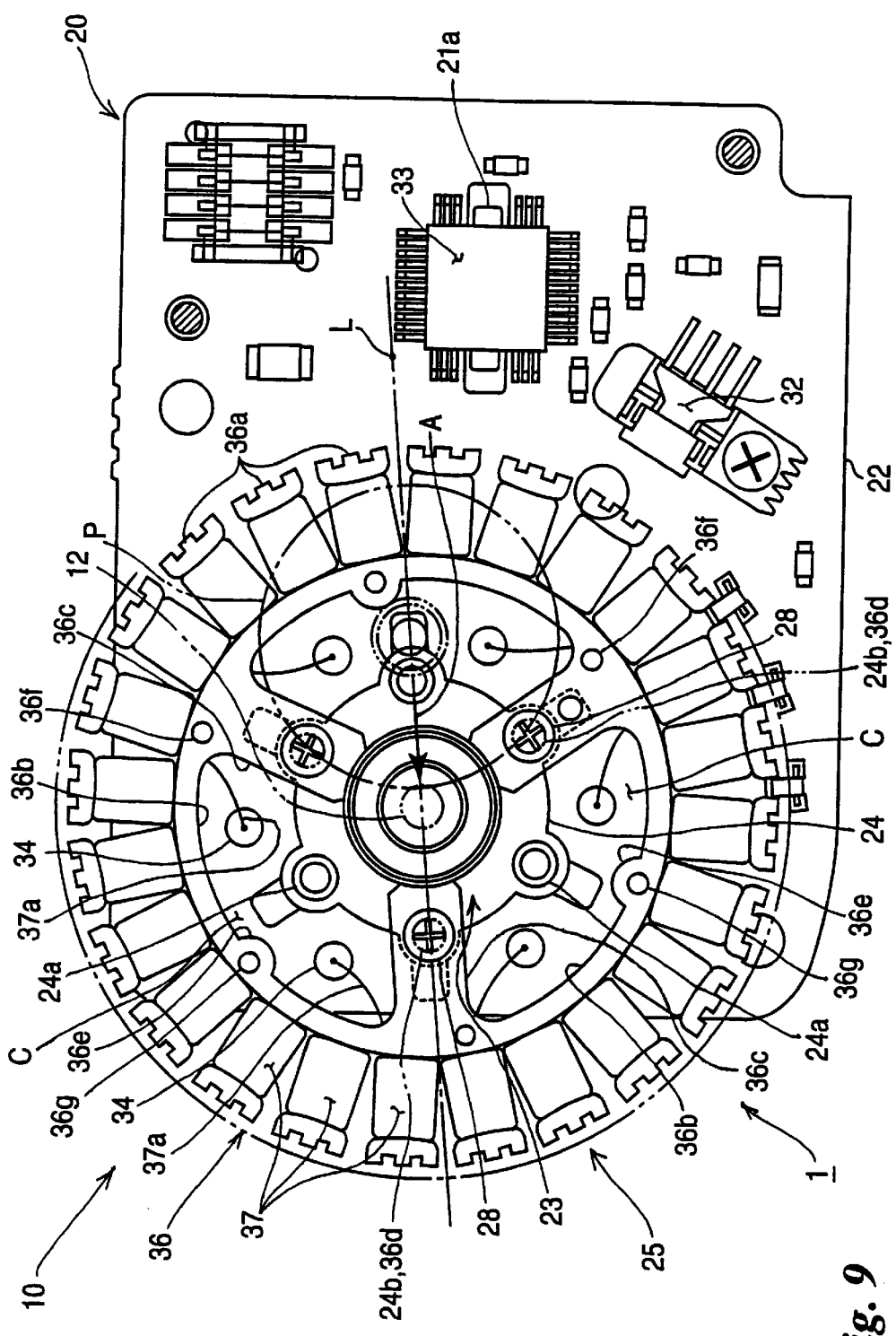
FIG. 9 is a plan view taken in the direction of an arrow 2 of the brushless motor shown in FIG. 8, wherein a rotor is removed from the brushless motor.
Figure 10:
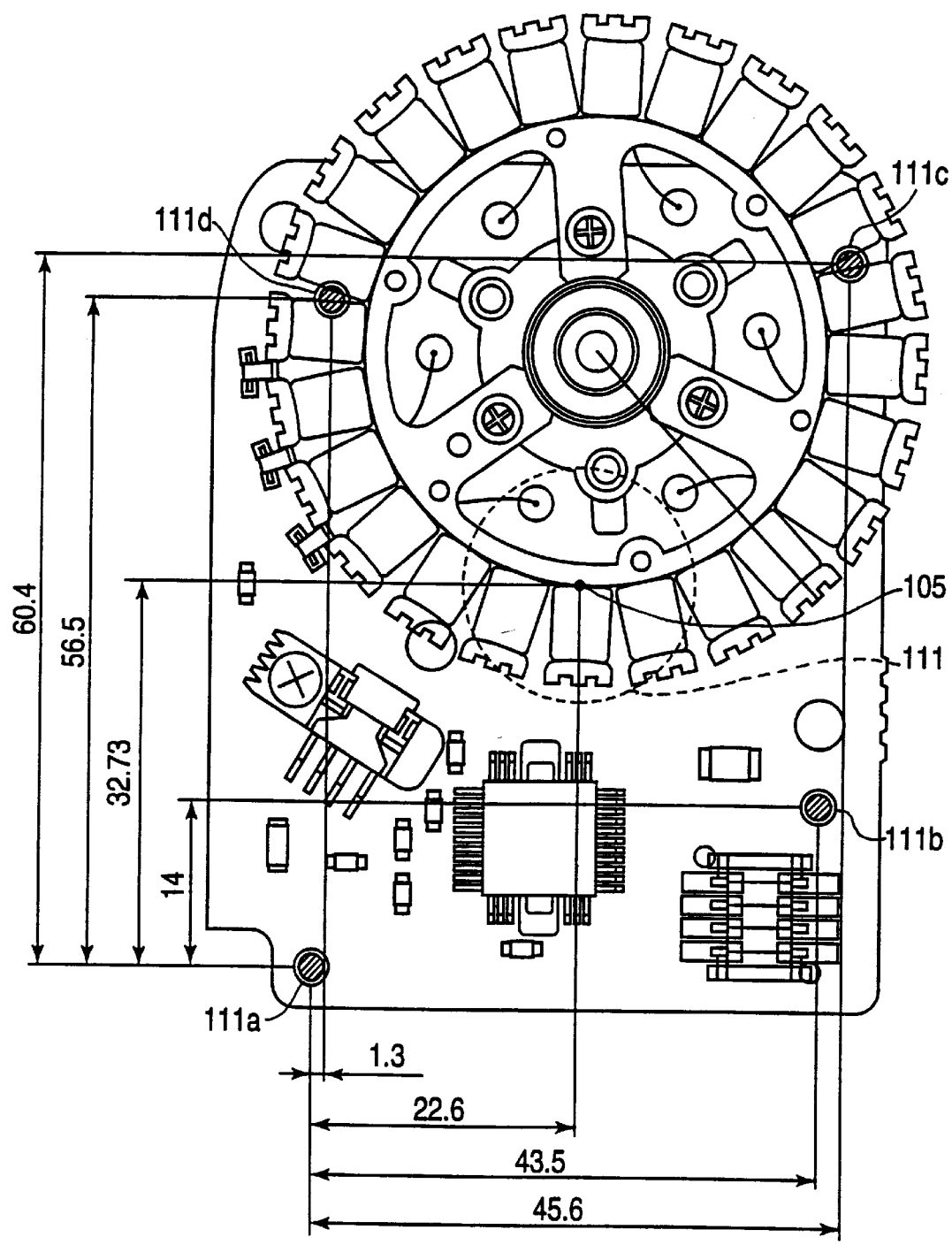
FIG. 10 is a plan view showing the brushless motor shown in FIG. 9, wherein the calking centroid with respect to calking sections is depicted.

Next, the description is given of a second embodiment of a brushless motor of the present invention referring to FIGS. 8 to 10.

FIG. 8 is a sectional view showing a brushless motor of a second embodiment of the present invention;

FIG. 9 is a plan view taken in the direction of an arrow 2 of the brushless motor shown in FIG. 8, wherein a rotor is removed from the brushless motor; and FIG. 10 is a plan view showing the brushless motor shown in FIG. 9, wherein the calking centroid with respect to calking sections is depicted.

As shown in FIG. 8, a brushless motor 1 of a second embodiment of the present invention generally comprises a rotor 10 and a stator 20. The rotor 10 comprises a rotor yoke 11, a capstan shaft 12 provided at a center of the rotor yoke 11, driving magnets 13 provided around an internal circumference of the rotor yoke 11, frequency generating magnets (referred to as FG magnets) 14 and a pulley 15 provided at a center of the rotor yoke 11 for driving external devices and a retainer 16 provided at a middle of the capstan shaft 12.

A stator 20 comprises a motor base 21, a printed circuit board 22 stacked at a bottom of the motor base 21, a bearing holder 23 having a cylindrical section 23a and a flange 24, and a stator coil assembly 25. The cylindrical section 23a of the bearing holder 23 penetrates through both the printed circuit board 22 and the motor base 21. Both the printed circuit board 22 and the motor base 21 are mounted on an upper surface of the flange 24, and the stator coil assembly 25 is mounted on a lower surface of the flange 24.

Reference character 21a designates a protruding section provided in the motor base 21 for contacting with electric parts, 27a and 27b oilless bearings for rotatably supporting the capstan shaft 12, 28 a screw for installing the bearing holder 23, 29 a thrust cup interposed between the bearing holder 23 and the retainer 16, P a pinch roller to drive a tape with the capstan shaft 12.

Referring to FIG. 9, on the printed circuit board 22 there are mounted a magnetic resistance element (referred to as MR element) 32 and IC (integrated circuit) 33, and connecting sections 34 are formed.

The stator coil assembly 25 comprises a ring core 36 and stator coils 37 wound around the ring core 36.

Specifically, the ring core 36 comprises protruding poles 36a for winding plural stator coils 37, a ring section 36b for connecting internal circumference of the protruding poles 36a. The ring section 36b has three installation branches 36c extending toward a center of the ring section 36b for attachment. Further, a reference character 36d designates mounting holes, 36e protruding portions for calking, 36f, 36g calking portions.

Distal ends 37a of each of the stator coils 37 are connected to the connecting sections 34, 34 so as to electrically connect the printed circuit board 22.

Further, a reference character 24a designates motor base installation sections provided in the flange 24, and 24b core installation sections provided in the flange 24.

Referring to FIG. 10, the brushless motor 1 of the second embodiment has the same stator structure as that of the first embodiment in the present invention.

As explained for the first embodiment of the present invention, in the stator structure of the second embodiment of the present invention, the stator substrate 114 has a double-layer structure of the printed circuit board 22 and the motor base 21 made of a zinc steel sheet, and they are calked together at the four calking sections 101a, 101b, 101c, 101d. At that time, the calking centroid 105 is determined from the four calking sections 101a, 101b, 101c, 101d. The electric parts are not provided within the flat circular area 111 having a diameter of 20 mm of which center agrees to the calking centroid 105. Upon calking, the calking sections 101a, 101b, 101c, 101d located around the outer circumference of the flat circular area 111 are calked by causing the flat circular area 111 to be held with the calking retainer 109 of the calking jig 104 shown in FIG. 1. Thus, each of the calking sections 101a, 101b, 101c, 101d in the printed circuit board 22 is equally pressed with the calking pins 110 of the calking jig 104, resulting in a prevention of the warp and rising of the printed circuit board 22.

Next, the description is given of the structural features and the effectiveness thereof in the present invention.

In the ring section 36b, there are defined fan-shaped cutouts C between the installation branches 36c, 36c so that the printed circuit board 22 is partially exposed. The connecting sections 34 are formed on the exposed parts of the printed circuit board 22. Accordingly, it is possible to directly connect the distal ends 37a of the stator coils 37 to the connecting sections 34, this enables an effective assembly of the brushless motor and a reliable brushless motor.

The ring section 36b of the ring core 36 is provided with the three installation branches 36c radially at an equal angular interval protruding toward the center direction of the ring section 36b, and the flange 24 is provided with the motor base installation sections 24a positioned at an equal angular distance from the adjacent installation branches 36c and on a same circumference as that of the core installation section 24b. When the brushless motor 1 is assembled, the motor base 21 and the printed circuit board 22 are mounted together on the flange 24 at the motor base installation section 24a and the ring core 36 is mounted on the flange 24 at the core installation section 24b with the screws 28. Accordingly, upon installing the ring core 36 and the bearing holder 23 in the motor base 21, the installing positions of the ring core 36 and the motor base 21 can be optionally selected in a circumferential direction of the ring section 36b. This feature enables an easy assembly of the brushless motor 1.

Further, in order not to reduce a sectional area of magnetic circuit due to a provision of the calking portion 36g the protruding portions 36e for calking are formed to protrude from the ring section 36b in a semicircular shape toward the center of the ring section 36b, resulting in no variations of magnetic resistance values between the magnetic circuits relative to the protruding poles 36a close to the calking portions 36g and the magnetic circuits of the protruding poles 36a remote from the calking portions 36g. Thus, it is possible to prevent the variation of the magnetic characteristics in the magnetic circuit of the stator 20, resulting in a reduction of unevenness of torque developed by the brushless motor 1.

Upon applying the brushless motor 1 to a device, a pressing direction shown with an arrow A of a pinch roller P is determined along a line L extended from one of the motor base installation section 24a to one of the installation branches 36c. Accordingly, it is possible to prevent an overall inclination of the brushless motor 1 when the capstan shaft 12 is pushed in the direction shown with the arrow A along the line L by the pinch roller P.

According to the present invention, the motor is assembled by causing the flange of the bearing holder to be interposed between the motor base and the plural installation branches together with the printed circuit board underneath, and ends of the stator coils are connected to respective terminal sections provided on the printed circuit board being partially exposed through the cutout portions defined between the plural installation branches of the ring section. Thus, upon installing the ring core and the bearing holder to the motor base, the installing positions of the ring core and the motor can be optionally decided in a circumferential direction of the ring section. This feature enables an easy assembly of the motor.

Further, according to the present invention, a pinch roller of an apparatus is vertically pushed to the capstan shaft of the motor in a direction along a line extended from the capstan shaft to one of the plural branch sections.

Thereby, the inclination of the capstan shaft of the motor caused by the pushing force exerted from the pinch roller is effectively prevented.

What is claimed is:

1. A motor composed of a rotor and a stator, the stator including a motor base, a printed circuit board stacked on a bottom of the motor base and a bearing holder mounted on the motor base and a magnetic core section having a plurality of stator coils, the rotor including a capstan shaft rotatably supported by the bearing holder through bearing means, a rotor yoke provided at an end of the capstan shaft, wherein the rotor is rotated by a mutual magnetic action between magnets provided on the rotor yoke and the plurality of the stator coils of the stator, wherein the bearing holder is provided with a flange protruding therefrom, the flange having motor base installation sections and core installation sections, and wherein the magnetic core section has a ring section provided with plural magnetic cores around an outer circumference thereof and has plural installation branches protruding radially toward a center of the ring section and respectively having installation portions connected respectively to the core installation sections of the flange, the plural installation branches defining cutout portions therebetween, and wherein the motor is assembled by causing the flange of the bearing holder to be interposed between the motor base and the plural installation branches together with the printed circuit board underneath, and ends of the stator coils are connected to respective terminal sections provided on the printed circuit board being partially exposed through the cutout portions defined between the plural installation branches of the ring section.

2. A motor as claimed in claim 1, wherein the plural installation branches are three installation branches disposed at an equal angular interval therebetween, and wherein the motor base installation sections are disposed at an equal angular distance from two adjacent installation branches and on a circumference on which the installation portions are also disposed circularly with respect to the center of the ring section.

3. A method of installing a motor composed of a stator and a rotor, the stator including a motor base, a bearing holder mounted on the motor base and a magnetic core section having a plurality of stator coils, the rotor including a capstan shaft rotatably supported by the bearing holder through bearing means, a rotor yoke provided at an end of the capstan shaft, wherein the rotor is rotated by a mutual magnetic action between magnets provided on the rotor yoke and the plurality of the stator coils of the stator, wherein the bearing holder is provided with a flange protruding therefrom; the flange having motor base installation sections and core installation sections; and wherein the core section has a ring section provided with plural magnetic cores around an outer circumference thereof and plural installation branches protruding toward a center of the ring section and having respective installation portions connected respectively to the core installation sections of the flange, and wherein the motor is assembled by causing the flange of the bearing holder to be interposed between the motor base and the plural installation branches in such a manner that the motor base installation sections of the flange are exposed between the plural installation branches, and wherein a pinch roller of an apparatus is disposed on and pushed along a line toward the capstan shaft of the motor, wherein the line extends from one of the motor base installation sections to one of the plural installation branches.

* * * * *